United States Patent
Charrat

(10) Patent No.: US 6,700,551 B2
(45) Date of Patent: Mar. 2, 2004

(54) ANTENNA SIGNAL AMPLITUDE MODULATION METHOD

(75) Inventor: Bruno Charrat, Aix en Provence (FR)

(73) Assignee: Inside Technologies, Saint Clement les Places (FR)

(*) Notice: Subject to any disclaimer, the term of this patent is extended or adjusted under 35 U.S.C. 154(b) by 177 days.

(21) Appl. No.: 09/962,889

(22) Filed: Sep. 25, 2001

(65) Prior Publication Data

US 2002/0072342 A1 Jun. 13, 2002

Related U.S. Application Data

(63) Continuation of application No. PCT/FR00/00712, filed on Mar. 22, 2000.

(30) Foreign Application Priority Data

Mar. 25, 1999 (FR) .............................. 99 04108

(51) Int. Cl.$^7$ ................................ H01Q 1/36

(52) U.S. Cl. ................ 343/895; 235/487; 235/492

(58) Field of Search ..................... 343/895, 745, 343/749; 235/440, 487, 492; 340/872.31

(56) References Cited

U.S. PATENT DOCUMENTS

| 3,003,122 | A | | 10/1961 | Gerhard ........................ 332/9 |
|---|---|---|---|---|
| 4,490,854 | A | | 12/1984 | Bensussan et al. ......... 455/118 |
| 4,529,950 | A | | 7/1985 | Chazenfus et al. ............ 332/9 |
| 4,818,855 | A | * | 4/1989 | Mongeon et al. ........... 235/440 |
| 5,170,046 | A | * | 12/1992 | Kusakabe .................... 235/492 |
| 5,345,231 | A | * | 9/1994 | Koo et al. ............. 340/870.31 |
| 6,540,147 | B2 | * | 4/2003 | Charrat ....................... 235/492 |

FOREIGN PATENT DOCUMENTS

| DE | 196 27 640 | 9/1997 |
|---|---|---|
| EP | 0 693 843 | 1/1996 |

* cited by examiner

*Primary Examiner*—Tan Ho
(74) *Attorney, Agent, or Firm*—Patterson, Thuente, Skaar & Christensen, P.A.

(57) ABSTRACT

A method for modulating the amplitude of an antenna signal applied to an inductive-type antenna circuit by a control circuit having binary ports that can be set to high impedance and with a non-zero internal resistor. The signal providing the electric power supply of the antenna circuit is delivered by at least two ports of the control circuit, and the amplitude of the antenna signal is modulated by changing the output state of at least one of the ports. Particularly applied to contactless smart card readers.

8 Claims, 5 Drawing Sheets

ANTENNA SIGNAL AMPLITUDE MODULATION METHOD

This is a continuation of application PCT/PR60/00712, filed on Mar. 22, 2000.

BACKGROUND OF THE INVENTION

The present invention relates to an inductive coupling data transmission device, comprising an inductive antenna circuit driven by an antenna signal and a control circuit comprising binary ports that can be set to high impedance and that have a non-zero internal resistor.

In particular, the present invention relates to devices designed to exchange data with portable electronic objects comprising a contactless integrated circuit, such as contactless smart card readers, electronic label scanners, electronic badge scanners, . . .

According to draft standards ISO 14443-2/A or 14443-2/B, hereinafter referred to as "ISO/A" and "ISO/B", the antenna coil of a contactless integrated circuit reader is driven by an antenna signal oscillating at a frequency of 13.56 MHz. The data transmission to the integrated circuit is carried out by modulating the amplitude of the antenna signal, with a modulation depth of 100% in the case of standard ISO/A or 10% in the case of standard ISO/B.

FIG. 1 represents a classical data transmission device 1 comprising a microprocessor 2, an oscillator 3, a modulation transistor 4 and a resonant-type antenna circuit 10. The antenna circuit 10 comprises an antenna coil 11 in parallel with a capacitor 12 and receives a direct supply voltage VDD through an inductor 13 and an insulation capacitor 14. The modulation transistor 4 is connected to the terminals of the coil 11 by means of the insulation capacitor 14. The oscillator 3 delivers a signal S1 oscillating at 13.56 MHz and the microprocessor 2 delivers an amplitude modulation binary signal S2 to a port P1. Signals S1 and S2 are applied to an AND gate 5 the output of which delivers a modulation signal S3 applied to the gate of transistor 4, which is shown in FIG. 1. The antenna signal Sa passing through the coil 11 is the image of signal S3.

SUMMARY OF THE INVENTION

The advantage of this data transmission device is that the structure is relatively simple but it only allows the amplitude of the antenna signal to be modulated at 100% (ISO/A). To obtain a 10% modulation of the antenna signal Sa (ISO/B), the device becomes more complex and other elements must be added to it.

The device becomes even more complex if it is to be compatible with standards ISO/A and ISO/B so as to be able to transmit data to two different types of integrated circuits. In this case, as shown by FIG. 2, the modulation switch 4 is replaced by a modulation circuit 9 represented in block form. The modulation circuit 9 receives signals S1, S2 and a signal $S_{AB}$ delivered by a port P2 of the microprocessor, allowing the type of modulation required to be selected. To achieve this modulation circuit 9 various electric and/or electronic components are required.

Therefore, one object of the present invention is to provide a data transmission device of the type described above that can modulate the antenna signal with a modulation depth of less than 100% while being simple in structure and inexpensive to produce.

One more particular object of the present invention is to provide a data transmission device that can be multi-purpose and that can modulate the antenna signal with several modulation depths, particularly modulation depths of 10% and 100%.

The present invention also relates to receiving data sent by a contactless integrated circuit by the charge modulation method. In this case, the coil 11 of the data transmission device described above receives a charge modulation signal by inductive coupling, that is mixed with the antenna signal Sa. The charge modulation signal must be extracted from the antenna signal Sa and demodulated by adequate filtering before being decoded. Known demodulation and filtering systems are inconvenient in that they are complex if they are to be compatible with several charge modulation protocols, particularly those stipulated by standards ISO/A and ISO/B.

Thus, another object of the present invention is to provide a demodulation device that is compatible with several charge modulation protocols, while being simple in structure and inexpensive to produce.

To achieve these objects, the present invention provides a method for modulating the amplitude of the antenna signal of an inductive antenna circuit comprising a coil, by means of a control circuit comprising binary ports that can be set to high impedance state and with a non-zero internal resistor, a method in which the antenna circuit is electrically powered by at least two ports of the control circuit, and comprising the steps of: setting the ports providing the electric supply of the antenna circuit to "1", to supply the antenna circuit at full power level, and changing the state of at least one of the ports providing the electric supply of the antenna circuit, to modulate the amplitude of the antenna signal.

According to one embodiment, the ports providing the electric power supply of the antenna circuit are set to "0" for a 100% modulation of the antenna signal.

According to one embodiment, at least one port is set to high impedance state while the other port or ports are maintained on "1" for a modulation of the antenna signal amplitude of less than 100%.

According to one embodiment, the antenna signal is also modulated in frequency by switch means connected to the terminals of the coil and controlled by an alternative signal.

The present invention also relates to an inductive coupling data sending device, comprising an inductive-type antenna circuit comprising a coil through which an antenna signal passes, a control circuit of the antenna circuit comprising binary ports that can be set to high impedance and with a non-zero internal resistor, in which the antenna circuit is electrically powered by at least two ports of the control circuit, and the control circuit is arranged to modulate the amplitude of the antenna signal in compliance with the method of the present invention.

According to one embodiment, the device comprises an oscillator delivering an alternative signal and switch means controlled by the alternative signal, arranged at the terminals of the antenna coil to modulate the frequency of the antenna signal.

The present invention also relates to a data send/receive device of the type described above, comprising a band-pass filter and a low-pass filter arranged to receive a charge modulation signal present in the antenna signal on a first terminal, and each connected by their other terminal to a port of the control circuit.

BRIEF DESCRIPTION OF THE DRAWINGS

These and other features of the present invention shall be presented in greater detail in the following description of a data transmission method and device according to the present invention, and of a data receiving device according to the present invention, in relation with the following figures.

DESCRIPTION OF THE PREFERRED EMBODIMENTS

First aspect of the present invention: antenna signal modulation.

Figure 1:
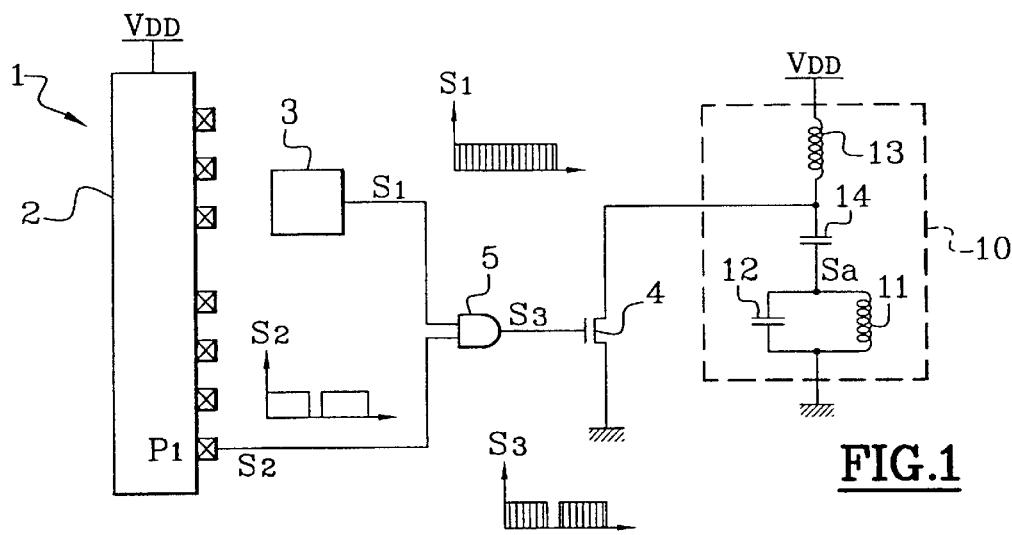
FIGS. 1 and 2 described above are wiring diagrams of classical induction data transmission devices.
Figure 2:
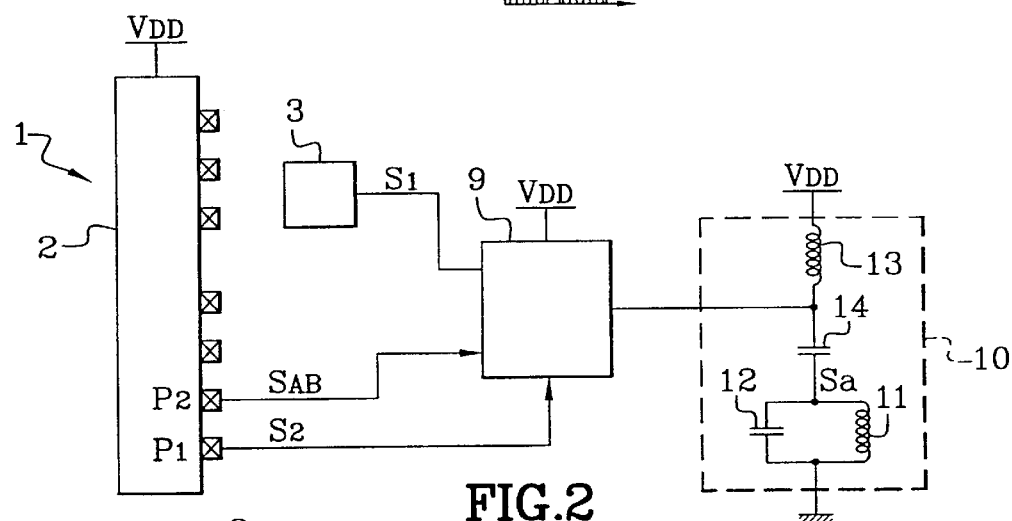
Figure 3:
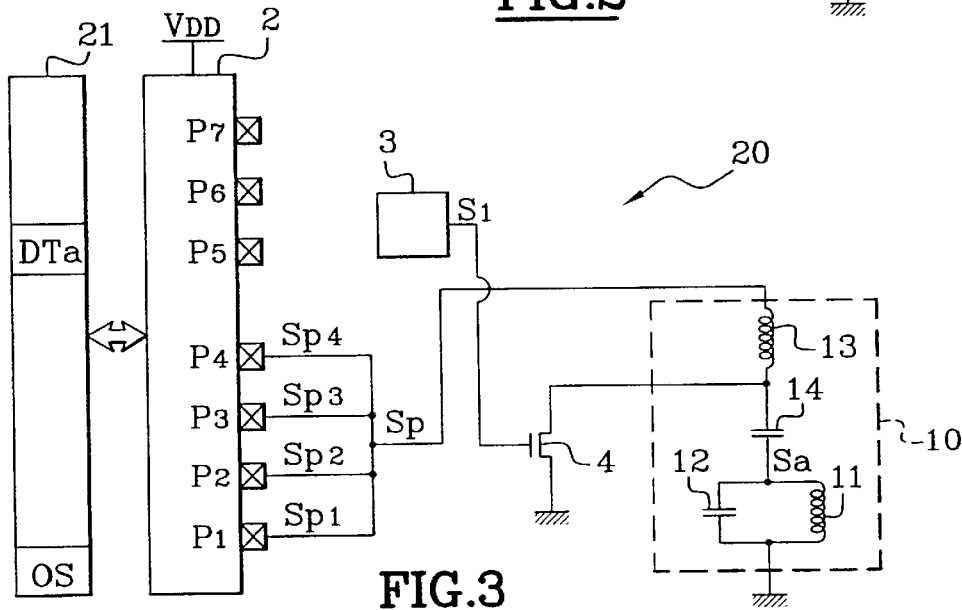
FIG. 3 is the wiring diagram of a data transmission device according to the present invention.

FIG. 3 represents in a diagram a data transmission device 20 according to the present invention, the structure of which is very similar to that of the device in FIG. 2. The device 20 contains the antenna circuit 10, the microprocessor 2 powered by the voltage VDD, the oscillator 3 delivering a signal S1 at 13.56 MHz, and the modulation switch 4 connected to the terminals of the coil 11 by means of the insulation capacitor 14. The microprocessor 2 comprises binary ports P1 to P7 that can be set to "1" (voltage VDD), to "0" (output of the port to the ground) or to high impedance state. Finally, the microprocessor 2 is equipped with a memory 21 which contains, in particular, data DTa that are to be sent by modulating the amplitude of the antenna signal Sa, and the microprocessor operating system OS.

According to the present invention, the electric power supply of the antenna circuit 10 is provided by several microprocessor ports connected in parallel, here the ports P1, P2, P3, P4. The ports P1 to P4 deliver a power supply signal Sp which is the combination of signals Sp1, Sp2, Sp3, Sp4 delivered by each of the ports, and which is applied to the antenna circuit 10 by means of the inductor 13 and the capacitor 14 described above. The inductor 13, or "shock" inductor, protects the ports P1 to P4 from overvoltages and the capacitor 14 insulates the coil 11 from the direct current. Here, the modulation switch 4 is controlled by the signal S1 and does not receive an amplitude modulation signal delivered by the microprocessor, as was the case in previous practices.

According to the method of the present invention, the four ports P1 to P4 are maintained on state "1" (voltage VDD present on the ports) to supply the antenna circuit 10 at full power level. The amplitude of the antenna signal Sa is modulated by modulating the amplitude of the power supply signal Sp itself, and the amplitude of the power supply signal Sp is modulated by changing the state of all or part of the ports P1 to P4.

Figure 4:
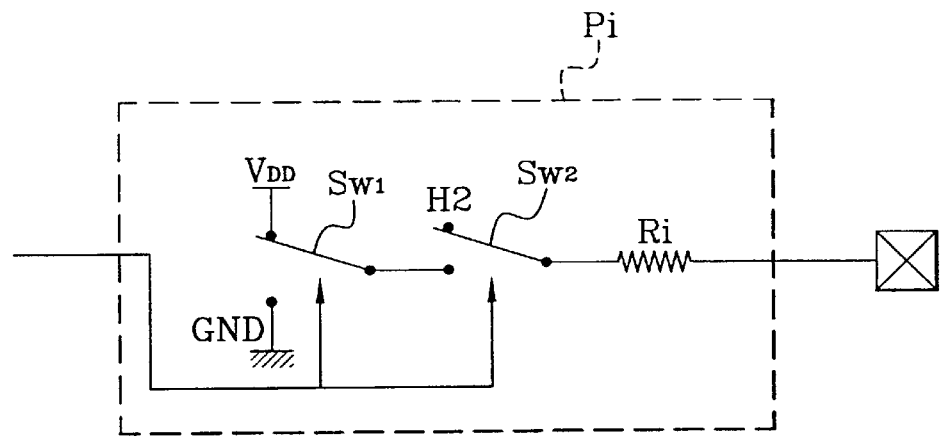
FIG. 4 is the wiring diagram of a microprocessor port.

Before describing this aspect of the present invention in further detail, it is reminded in relation with FIG. 4 that one microprocessor port Pi generally comprises a non-zero internal resistor Ri and can be shown in a simplified manner by an electric feeder comprising two switches Sw1, Sw2 and the resistor Ri in series. The switch Sw1 allows the output of the port Pi to be set to the power supply voltage $V_{DD}$ (logic "1") or to the ground (logic "0"). The switch Sw2 allows the switch Sw1 to be disconnected to set the output of the port Pi to the high impedance state HZ. The resistor Ri represents the internal resistor of the port Pi, and causes a voltage drop which is a function of the current delivered by the port.

Figure 5:
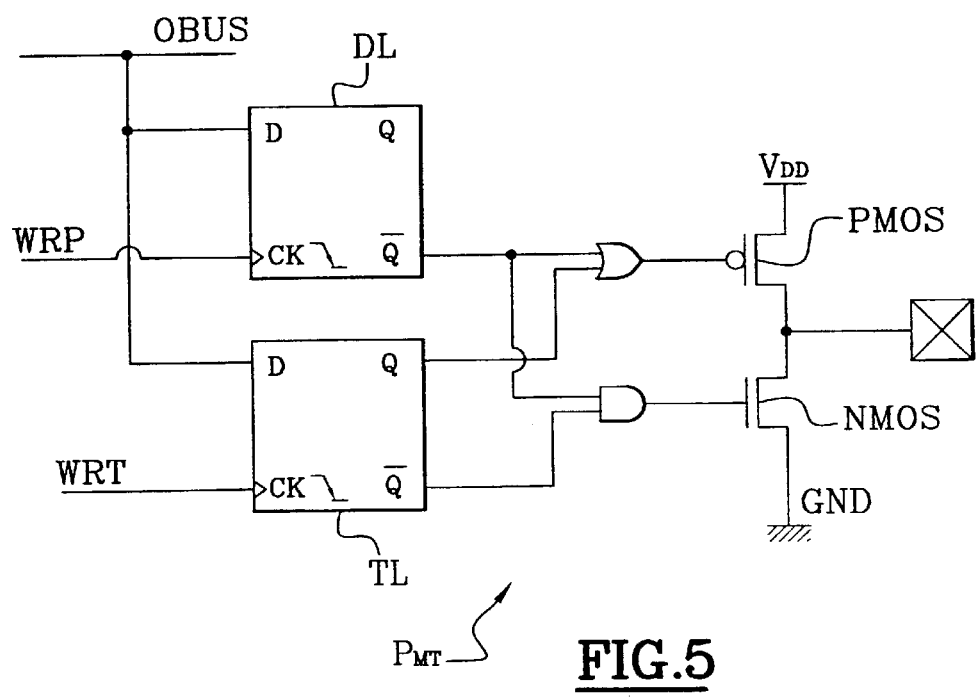
FIG. 5 is the logical diagram of a microprocessor port.

As a concrete example, FIG. 5 represents the logic diagram of a port $P_{MT}$ of the microprocessor PIC16C6X marketed by the company Microchip Technology™ Inc., used by the applicant to assess the present invention. The port $P_{MT}$ comprises two latches DL and TL controlled by means of the data bus DBUS of the microprocessor, and by port write WRP and port high impedance setting WRT signals. The output of the port is sampled at the midpoint of two output transistors PMOS and NMOS in series, powered by the voltage $V_{DD}$ and controlled by the outputs Q or /Q of the latches DL, TL. Here, the internal resistor Ri of the port is the transistor PMOS resistor when it is in a transmission state (port output to 1).

Therefore, with reference to FIG. 3, the modulation of the antenna signal Sa is obtained by setting all the ports P1 to P4 to 0 or by setting certain ports to high impedance while the other ports are maintained on 1. In the first case, the power supply signal Sp is zero and the amplitude of the antenna signal Sa is modulated at 100% (standard ISO/A). In the second case, a more substantial current passes through the ports maintained on 1 and their internal resistor Ri causes the voltage of the power supply signal Sp to drop without cancelling it, such that the amplitude modulation of the antenna signal Sa is less than 100%.

In practice, the number of ports to be set to high impedance depends on the modulation depth sought and the electric properties of the ports used. With the microprocessor PIC16C6X powered by a voltage $V_{DD}$ of 5V, and an antenna circuit 10 that has a typical impedance in the order of 250Ω at 13.56 MHz, tests conducted by the applicant have shown that three out of four ports must be set to high impedance to obtain an antenna signal Sa amplitude modulation in the order of 10%, in compliance with standard ISO/B. More particularly, when the ports P1 to P4 are on "1" the current passing through each port is in the order of 5 mA, which represents an antenna current in the order of 20 mA. The voltage applied to the antenna circuit is in the order of 4.775 V. When three out of four ports are set to high impedance, such as the ports P2 to P4 for example, with the port P1 being maintained on 1, the current passing through the port P1 is in the order of 15 mA and the voltage applied to the antenna circuit is in the order of 4.3 V, i.e. an amplitude modulation of the antenna signal Sa in the order of 10%.

Thus, the device 20 in FIG. 3 has the advantage of being able to meet the standards ISO/A and ISO/B depending on the way in which the ports P1 to P4 are controlled, while being particularly simple in structure.

Figure 6:
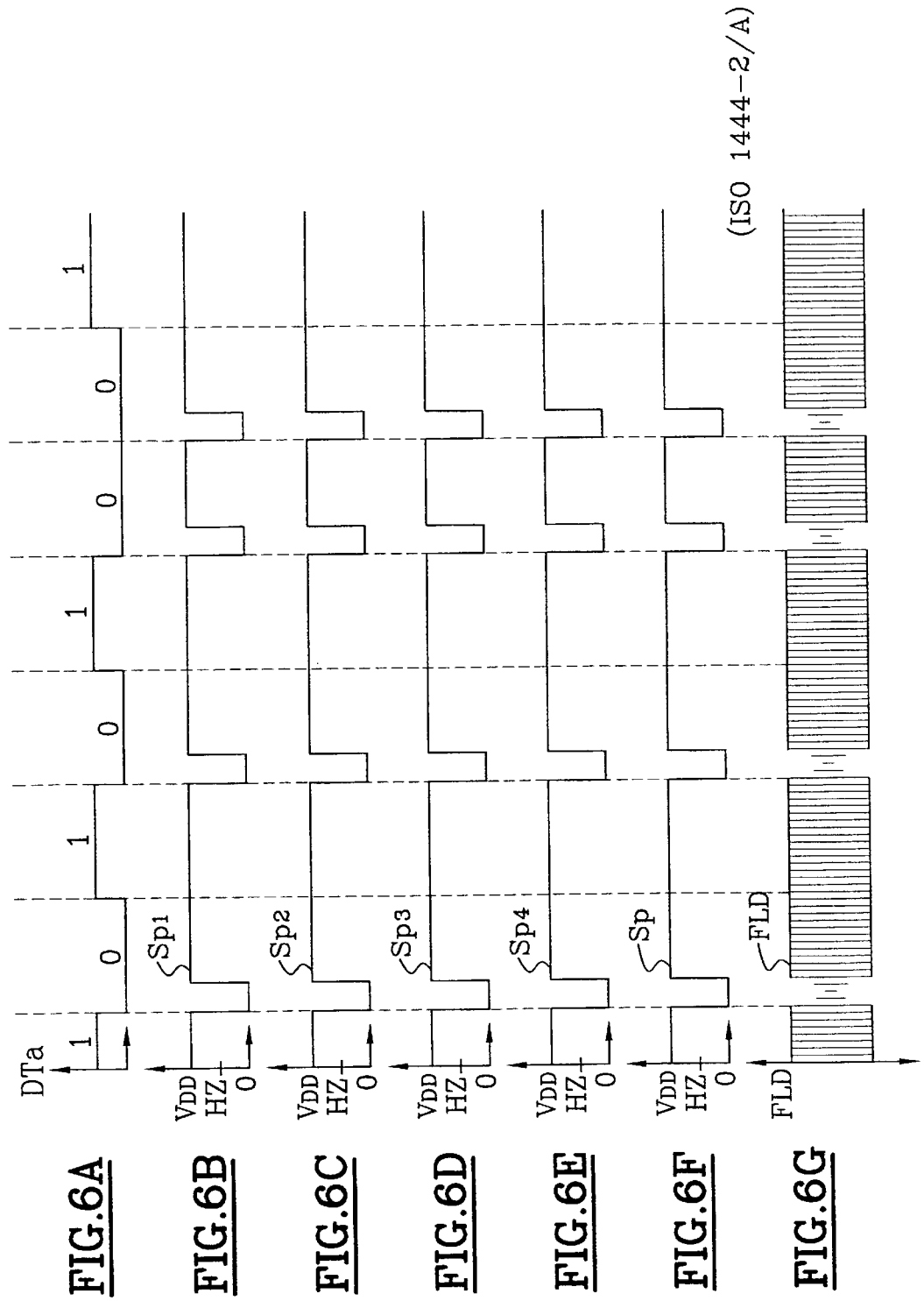
FIGS. 6A to 6G represent various signals occurring in the device in FIG. 3, according to a first aspect of the method of the present invention.
Figure 7:
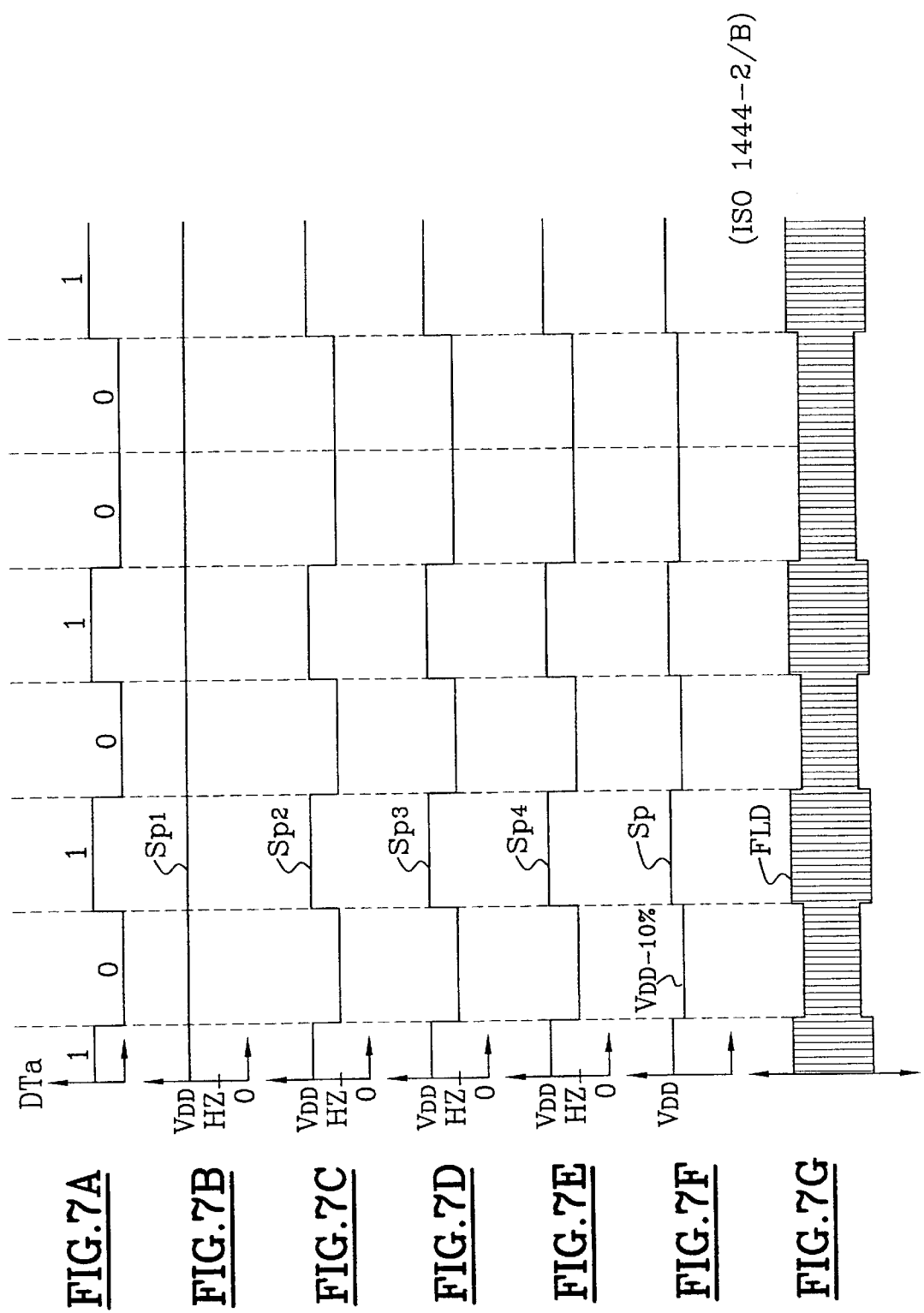
FIGS. 7A to 7G represent various signals occurring in the device in FIG. 3, according to a second aspect of the method of the present invention.

For a better understanding, the timing diagrams in FIGS. 6A to 6G show the control protocol of ports P1 to P4 for a data transmission according to the standard ISO/A, and the timing diagrams in FIGS. 7A to 7G show the control protocol of ports P1 to P4 for a data transmission according to the standard ISO/B. FIGS. 6A, 7A represent the logic signal DTa to be transmitted, constituted by a sequence of bits the values of which are only given as an example. FIGS. 6B to 6E, 7B to 7E represent the signals Sp1 to Sp4. FIGS. 6F, 7F represent the signal Sp. Finally, the aspect of the magnetic field FLD given off by the antenna coil 5 is shown in FIGS. 6G, 7G. On the timing diagrams in FIGS. 6B to 6F, 7B to 7F, the high impedance state is represented by a fictitious logic level HZ.

On FIGS. 6A to 6G, it can be seen that the magnetic field FLD is given off at full power level during the transmission of a bit to 1, the signal Sp being in the order of 5V. A bit to 0 is coded by a short pulse to 0 of the signal Sp, obtained by simultaneously setting ports P1 to P4 to 0 (signals Sp1 to Sp4 to 0). One pulse to 0 of the signal Sp causes a short interruption in the magnetic field FLD given off by the antenna coil 5 (100% modulation).

On FIGS. 7A to 7G, the magnetic field FLD is also given off at full power level during the transmission of a bit to 1. On the other hand, a bit to 0 is coded by a 10% amplitude modulation of the signal Sp throughout the time T of the bit (coding NRZ), T being the binary period of the signal DTa. The 10% modulation is ensured by maintaining the port P1 on 1 and by setting ports P2, P3, P4 to high impedance (signals Sp2, Sp3, Sp4 in the state HZ). The 10% modulation of the signal Sp causes a 10% modulation of the magnetic field FLD, since the signal Sp is the power supply signal of the antenna circuit 10.

It will be understood that the numerical values and combinations of controls described above are only examples. Those skilled in the art should implement the invention with more or less ports, depending on the features of the microprocessor used, the modulation rate sought and the impedance of the antenna circuit. If necessary, a single port may prove to be sufficient to achieve a device that only conforms to standard ISO/A, provided that the port can deliver sufficient current to achieve the maximum emission power of the magnetic field, which is defined by the application considered and the communication distance required.

Furthermore, although an example of an embodiment of the present invention was described above using a commercial microprocessor, any type of control circuit providing the above-mentioned features can be used to achieve the present invention. In particular, the present invention can be implemented by means of a specific integrated circuit of "ASIC" type ("Assigned Specific Integrated Circuit"). This specific integrated circuit can include a microprocessor or a programmable logic circuit comprising "port" type switch lines with a structure that is equivalent to that of a microprocessor port. In this case, the microprocessor ports dedicated to the antenna signal modulation, or the "port" type switch lines, can be connected inside the specific integrated circuit, such that the specific circuit only has one output contact stud to control the antenna circuit.

Second aspect of the present invention: embodiment of a circuit for receiving a signal transmitted by inductive coupling.

According to another aspect of the present invention, the ports of a microprocessor are also used to achieve, in a simple manner, an active filtering system used to receive data sent by integrated circuits using several communication protocols, particularly protocols ISO/A and ISO/B.

Figure 8:
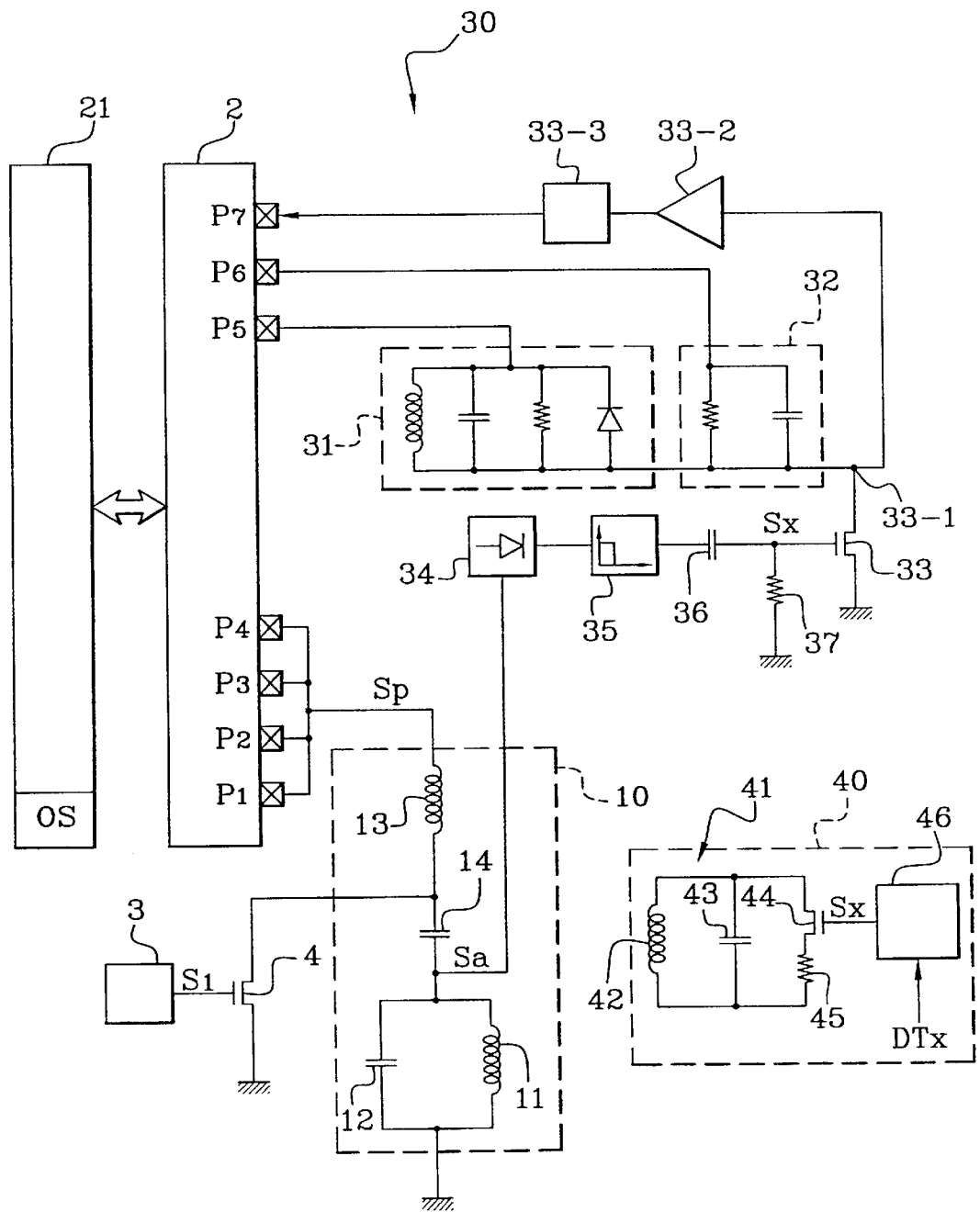
FIG. 8 is the wiring diagram of a data send/receive device according to the present invention.

FIG. 8 represents an inductive coupling data send/receive device 30 that uses this aspect of the present invention. The device 30 comprises the same elements as the device 20 in FIG. 3, described by the same references, and data receiving means which will be described below. The purpose of these receiving means is to extract a charge modulation signal from the antenna signal Sa that is sent by a contactless integrated circuit 40.

This integrated circuit 40, represented in a diagram in FIG. 8, comprises an antenna circuit 41 and a charge modulation system. The antenna circuit 41 comprises an antenna coil 42 and a capacitor 43 in parallel. The charge modulation system comprises for example a switch 44 and a resistor 45 in series connected to the terminals of the coil 42. The switch 44 is controlled by a modulation signal Sx delivered by an encoding circuit 46, which receives data DTx at input to be transmitted. When the coils 11 and 42 are sufficiently close, the signal Sx is passed on by inductive coupling in the coil 11 to form a component of the antenna signal Sa. The signal Sx comprises, in a classical manner, an alternative or sub-carrier component of a frequency of 847 KHz and must be extracted from the signal Sa and demodulated before being decoded by the microprocessor 2 or by any other appropriate decoding means.

According to the present invention, the receiving means comprise a band-pass filter 31 set to a frequency of 847 KHz and a low-pass filter 32 with a cut-off frequency of 847 KHz. Here, the band-pass filter 31 comprises an inductor, a capacitor, a resistor and a diode in parallel, and the low-pass filter 32 comprises a resistor and a capacitor in parallel. Each filter 31, 32 is connected by one of its ends to a port of the microprocessor 2, respectively P5 and P6. The other end of the filters 31, 32 is connected to a common node 33-1. The node 33-1 is connected to the output of an amplifying element 33 that is here in the form of a transistor FET having its drain connected to the node 33-1 and its source connected to the ground. The node 33-1 is also connected to a port P7 of the microprocessor by means of an amplifier 33-2 and a signal transformation device 33-3 of "trigger" or differential amplifier type. The antenna coil 11, through which the antenna signal Sa passes, is connected to a half-wave rectifier 34 the output of which is applied to a low-pass filter 35 having a cut-off frequency in the order of one Megahertz so as to remove any component at 13.56 MHz. The output of the filter 35 is applied to the input of the amplifying element 33 (here the gate of the transistor FET) by means of a capacitor 36 and a pull-down resistor 37.

Therefore, the amplifying element 33 receives the charge modulation signal Sx at input, which is extracted from the antenna signal Sa by the low-pass filter 35. When the ports P5, P6 are at high impedance, the filters 31, 32 are disconnected (in open circuit) and the node 33-1 is at high impedance. When a port P5, P6 is set to 1 while the other port is maintained at high impedance, the corresponding filter 31, 32 is switched on and the envelope of the signal Sx can be extracted, by removing the sub-carrier. The envelope of the signal Sx is sent to the port P7 of the microprocessor to be decoded, after being amplified by the amplifier 33-2 and transformed by the trigger 333.

The device 30 according to the present invention has the advantage of being simple while enabling data to be received that have been sent according to various transmission protocols, the function of the ports P6 and P7 being to switch the filters 31, 32 while providing their electric power supply. For example, the microprocessor 2 selects and activates the low-pass filter 32 by setting the port P6 to "1" when the signal Sx is a sub-carrier of a frequency of 847 KHz coded Manchester (standard ISO/A). The microprocessor 2 selects and activates the band-pass filter 31 when the signal Sx is a sub-carrier of 847 KHz coded BPSK ("Binary Phase Shift Keying"), i.e. by phase jumps (standard ISO/B).

Generally speaking, the low-pass filter 32 allows the frequency of any type of signal Sx to be demodulated if the frequency thereof is lower or equal to 847 KHz, including when the signal Sx is a binary signal without sub-carrier. The band-pass filter 31 is more particularly dedicated to the phase demodulation of the signal Sx when it is coded BPSK and has a frequency of 847 KHz.

It will be understood that other filters can be provided and connected to other ports of the microprocessor. Moreover, the frequencies of 13.56 MHz and of 847 KHz have only been given as examples described by the draft standard ISO 14443-2.

Generally speaking, the two aspects of the present invention are independent of each other. However, their juxtaposition enables multi-purpose contactless integrated circuit readers to be achieved at a low cost price, the final object of the present invention being to encourage and promote the use of contactless integrated circuits in "general public" applications such as electronic purses, telephone cards, electronic transport tickets, object identification (electronic labels), access control (electronic badges).

What is claimed is:

1. Method for modulating the amplitude of the antenna signal of an inductive antenna circuit comprising a coil, by means of a control circuit comprising binary ports that can be set to high impedance state and with a non-zero internal resistor, characterised in that the antenna circuit is electrically powered by at least two ports of the control circuit, and in that it comprises steps of:

setting the ports providing the electric supply of the antenna circuit to "1", to supply the antenna circuit at full power level, and changing the state of at least one of the ports providing the electric supply of the antenna circuit, to modulate the amplitude of the antenna signal.

2. Method according to claim 1, in which the ports providing the electric power supply of the antenna circuit are set to "0", for 100% modulation of the antenna signal.

3. Method according to claim 1, in which at least one port is set to high impedance state while the other port or ports are maintained on "1", for a modulation of the antenna signal amplitude of less than 100%.

4. Method according to claim 1, in which the antenna is also modulated in frequency by switch means connected to the terminals of the coil and controlled by an alternative signal.

5. Inductive coupling data sending device, comprising an inductive-type antenna circuit comprising a coil through which an antenna signal passes, a control circuit of the antenna circuit comprising binary ports that can be set to high impedance and with a non-zero internal resistor, characterised in that the antenna circuit is electrically powered by at least two control circuit ports and in that the control circuit is arranged to modulate the amplitude of the antenna signal in compliance with the method of claim 1.

6. Device according to claim 5, comprising an oscillator delivering an alternative signal, and switch means controlled by the alternative signal arranged at the terminals of the antenna coil to modulate the frequency of the antenna signal.

7. Device according to claim 5, comprising a band-pass filter and a low-pass filter arranged to receive a charge modulation signal present in the antenna signal on a first terminal, and each connected by their other terminal to a port of the control circuit.

8. Device according to claim 7, in which the control circuit is arranged to select one of the filters by setting the port connected to the filter to be selected to "1", and by setting the port connected to the other filter to high impedance state.

* * * * *